(12) United States Patent
Stoev et al.

(10) Patent No.: US 9,013,920 B2
(45) Date of Patent: Apr. 21, 2015

(54) SYSTEMS AND METHODS OF WRITE PRECOMPENSATION TO EXTEND LIFE OF A SOLID-STATE MEMORY

(71) Applicant: Western Digital Technologies, Inc., Irvine, CA (US)

(72) Inventors: Kroum S. Stoev, Pleasanton, CA (US); Haibo Li, Sunnyvale, CA (US); Dengtao Zhao, Santa Clara, CA (US); Yongke Sun, Pleasanton, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

(21) Appl. No.: 13/936,116

(22) Filed: Jul. 5, 2013

(65) Prior Publication Data

US 2014/0301142 A1    Oct. 9, 2014

Related U.S. Application Data

(60) Provisional application No. 61/808,140, filed on Apr. 3, 2013.

(51) Int. Cl.
*G11C 16/06* (2006.01)
*G11C 16/34* (2006.01)

(52) U.S. Cl.
CPC .................. *G11C 16/3454* (2013.01)

(58) Field of Classification Search
USPC .............. 365/185.09, 185.12, 185.22, 185.28
See application file for complete search history.

(56) References Cited

U.S. PATENT DOCUMENTS

| | | |
|---|---|---|
| 6,856,556 B1 | 2/2005 | Hajeck |
| 7,126,857 B2 | 10/2006 | Hajeck |
| 7,430,136 B2 | 9/2008 | Merry, Jr. et al. |
| 7,447,807 B1 | 11/2008 | Merry et al. |
| 7,457,163 B2 | 11/2008 | Hemink |
| 7,502,256 B2 | 3/2009 | Merry, Jr. et al. |
| 7,509,441 B1 | 3/2009 | Merry et al. |
| 7,596,643 B2 | 9/2009 | Merry, Jr. et al. |
| 7,653,778 B2 | 1/2010 | Merry, Jr. et al. |
| 7,685,337 B2 | 3/2010 | Merry, Jr. et al. |
| 7,685,338 B2 | 3/2010 | Merry, Jr. et al. |
| 7,685,374 B2 | 3/2010 | Diggs et al. |
| 7,733,712 B1 | 6/2010 | Walston et al. |
| 7,765,373 B1 | 7/2010 | Merry et al. |
| 7,898,855 B2 | 3/2011 | Merry, Jr. et al. |
| 7,912,991 B1 | 3/2011 | Merry et al. |

(Continued)

OTHER PUBLICATIONS

International Search Report and Written Opinion dated Aug. 7, 2014 from from related PCT Serial No. PCT/US2014/032594, 11 pages.

*Primary Examiner* — Hoai V Ho

(57) ABSTRACT

Write precomensation mechanisms for non-volatile solid-state memory are disclosed. In one embodiment, programming verify voltage levels are lowered from the default levels in the early life of the solid-state memory. As memory errors increase beyond an error threshold, programming verify voltage levels are increased by one or more voltage step sizes. This programming verify voltage level increase can be performed until default levels are reached or exceeded. As a result of lowered programming verify voltage levels in the early life of the solid-state memory device, solid-state memory experiences less wear and the operational life of the memory can be extended. Disclosed write precomensation mechanisms can be used for single-level cell (SLC) and multi-level cell (MLC) memory.

25 Claims, 7 Drawing Sheets

(56) References Cited

U.S. PATENT DOCUMENTS

| | | | |
|---|---|---|---|
| 7,936,603 | B2 | 5/2011 | Merry, Jr. et al. |
| 7,962,792 | B2 | 6/2011 | Diggs et al. |
| 8,078,918 | B2 | 12/2011 | Diggs et al. |
| 8,090,899 | B1 | 1/2012 | Syu |
| 8,095,851 | B2 | 1/2012 | Diggs et al. |
| 8,108,692 | B1 | 1/2012 | Merry et al. |
| 8,122,185 | B2 | 2/2012 | Merry, Jr. et al. |
| 8,127,048 | B1 | 2/2012 | Merry et al. |
| 8,135,903 | B1 | 3/2012 | Kan |
| 8,151,020 | B2 | 4/2012 | Merry, Jr. et al. |
| 8,161,227 | B1 | 4/2012 | Diggs et al. |
| 8,166,245 | B2 | 4/2012 | Diggs et al. |
| 8,243,525 | B1 | 8/2012 | Kan |
| 8,254,172 | B1 | 8/2012 | Kan |
| 8,261,012 | B2 | 9/2012 | Kan |
| 8,296,625 | B2 | 10/2012 | Diggs et al. |
| 8,312,207 | B2 | 11/2012 | Merry, Jr. et al. |
| 8,316,176 | B1 | 11/2012 | Phan et al. |
| 8,341,339 | B1 | 12/2012 | Boyle et al. |
| 8,375,151 | B1 | 2/2013 | Kan |
| 8,392,635 | B2 | 3/2013 | Booth et al. |
| 8,397,107 | B1 | 3/2013 | Syu et al. |
| 8,407,449 | B1 | 3/2013 | Colon et al. |
| 8,423,722 | B1 | 4/2013 | Deforest et al. |
| 8,433,858 | B1 | 4/2013 | Diggs et al. |
| 8,443,167 | B1 | 5/2013 | Fallone et al. |
| 8,447,920 | B1 | 5/2013 | Syu |
| 8,458,435 | B1 | 6/2013 | Rainey, III et al. |
| 8,478,930 | B1 | 7/2013 | Syu |
| 8,489,854 | B1 | 7/2013 | Colon et al. |
| 8,503,237 | B1 | 8/2013 | Horn |
| 8,521,972 | B1 | 8/2013 | Boyle et al. |
| 8,549,236 | B2 | 10/2013 | Diggs et al. |
| 8,583,835 | B1 | 11/2013 | Kan |
| 8,601,311 | B2 | 12/2013 | Horn |
| 8,601,313 | B1 | 12/2013 | Horn |
| 8,612,669 | B1 | 12/2013 | Syu et al. |
| 8,612,804 | B1 | 12/2013 | Kang et al. |
| 8,615,681 | B2 | 12/2013 | Horn |
| 8,638,602 | B1 | 1/2014 | Horn |
| 8,639,872 | B1 | 1/2014 | Boyle et al. |
| 8,683,113 | B2 | 3/2014 | Abasto et al. |
| 8,700,834 | B2 | 4/2014 | Horn et al. |
| 8,700,950 | B1 | 4/2014 | Syu |
| 8,700,951 | B1 | 4/2014 | Call et al. |
| 8,706,985 | B1 | 4/2014 | Boyle et al. |
| 8,707,104 | B1 | 4/2014 | Jean |
| 8,745,277 | B2 | 6/2014 | Kan |
| 2007/0183210 | A1 | 8/2007 | Choi et al. |
| 2007/0253256 | A1* | 11/2007 | Aritome .................... 365/185.24 |
| 2008/0123420 | A1* | 5/2008 | Brandman et al. ....... 365/185.09 |
| 2009/0177931 | A1 | 7/2009 | Song et al. |
| 2010/0135082 | A1* | 6/2010 | Bathul et al. ............. 365/185.19 |
| 2010/0174849 | A1 | 7/2010 | Walston et al. |
| 2010/0250793 | A1 | 9/2010 | Syu |
| 2011/0099323 | A1 | 4/2011 | Syu |
| 2011/0131444 | A1 | 6/2011 | Buch et al. |
| 2011/0145663 | A1 | 6/2011 | Kong et al. |
| 2011/0283049 | A1 | 11/2011 | Kang et al. |
| 2012/0224430 | A1 | 9/2012 | Visconti et al. |
| 2012/0239858 | A1 | 9/2012 | Melik-Martirosian |
| 2012/0239991 | A1 | 9/2012 | Melik-Martirosian |
| 2012/0260020 | A1 | 10/2012 | Suryabudi et al. |
| 2012/0278531 | A1 | 11/2012 | Horn |
| 2012/0284460 | A1 | 11/2012 | Guda |
| 2012/0324191 | A1 | 12/2012 | Strange et al. |
| 2013/0077400 | A1 | 3/2013 | Sakurada |
| 2013/0132638 | A1 | 5/2013 | Horn et al. |
| 2013/0145106 | A1 | 6/2013 | Kan |
| 2013/0290793 | A1 | 10/2013 | Booth et al. |
| 2014/0059405 | A1 | 2/2014 | Syu et al. |
| 2014/0115427 | A1 | 4/2014 | Lu |
| 2014/0133220 | A1 | 5/2014 | Danilak et al. |
| 2014/0136753 | A1 | 5/2014 | Tomlin et al. |

* cited by examiner

SYSTEMS AND METHODS OF WRITE PRECOMPENSATION TO EXTEND LIFE OF A SOLID-STATE MEMORY

CROSS REFERENCE TO RELATED APPLICATIONS

This application claims priority to provisional U.S. patent application Ser. No. 61/808,140, filed on Apr. 3, 2013, which is hereby incorporated by reference in its entirety.

BACKGROUND

1. Technical Field

This disclosure relates to data storage systems. More particularly, the disclosure relates to systems and methods of write precompensation to extend life of a solid-state memory.

2. Description of the Related Art

Certain solid-state memory devices, such as flash drives, store information in an array of memory cells constructed with floating gate transistors. In single-level cell (SLC) flash devices, each cell stores a single bit of information. In multi-level cell (MLC) devices, each cell stores two or more bits of information. When a read operation is performed, the electrical charge levels of the cells are compared to one or more voltage reference values (also called "reading voltage level" or "voltage threshold") to determine the state of individual cells. In SLC devices, a cell can be read using a single voltage reference value. In MLC devices, a cell is read using multiple voltage references values. Certain solid-state devices allow for a memory controller to set reading voltage levels.

Various factors can contribute to data retention errors in solid-state memory devices. These factors include charge loss or leakage over time, and device wear caused by usage. When the number of bit errors on a read operation exceeds the ECC (error correction code) correction capability of the storage subsystem, the read operation fails.

BRIEF DESCRIPTION OF THE DRAWINGS

Various embodiments are depicted in the accompanying drawings for illustrative purposes, and should in no way be interpreted as limiting the scope of the inventions. In addition, various features of different disclosed embodiments can be combined to form additional embodiments, which are part of this disclosure. Throughout the drawings, reference numbers may be reused to indicate correspondence between reference elements.

DETAILED DESCRIPTION

Figure 1:
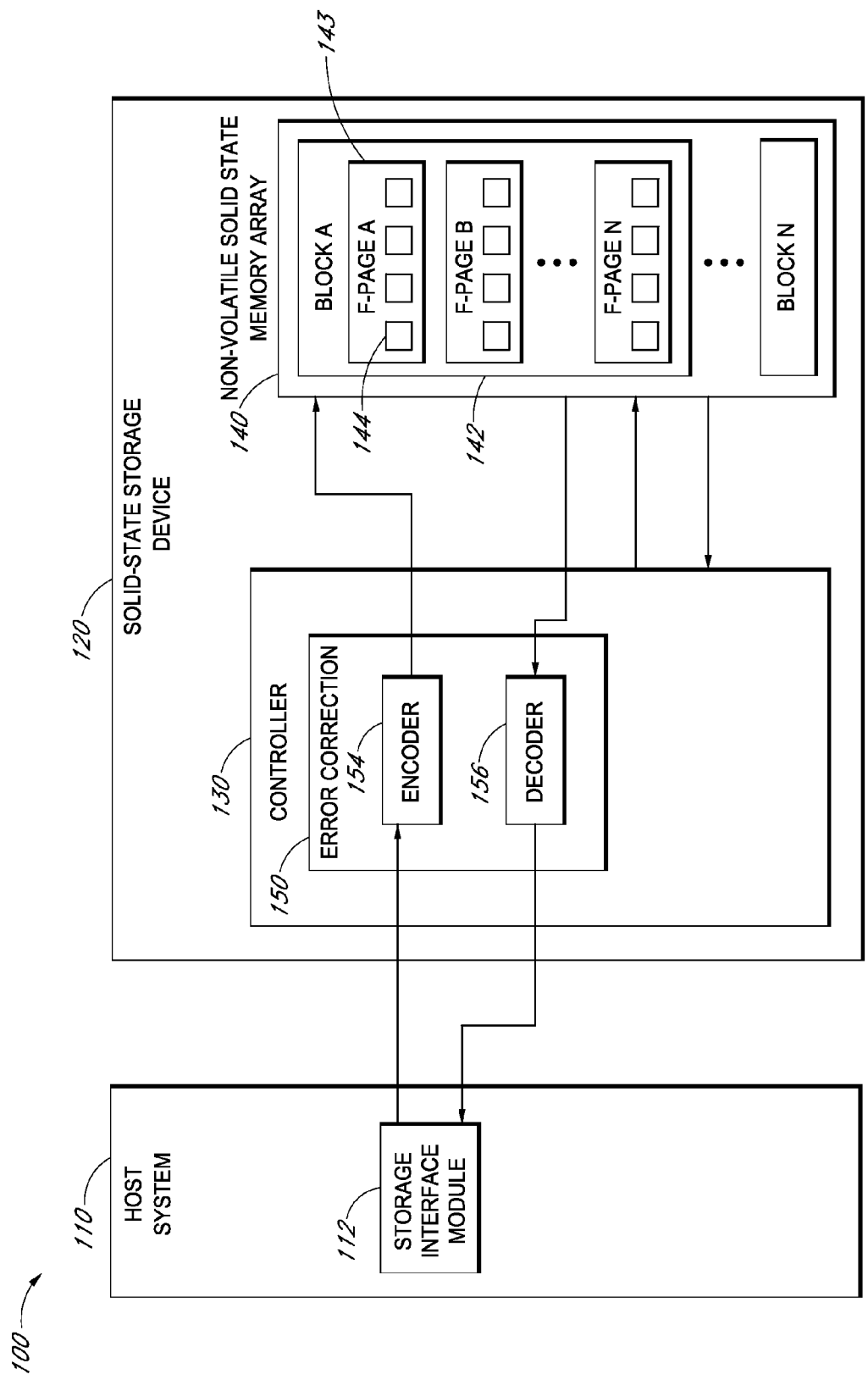
FIG. 1 is a block diagram illustrating an embodiment of a solid-state storage device that performs write precompensation.

While certain embodiments of the inventions are described, these embodiments are presented by way of example only, and are not intended to limit the scope of the inventions. Indeed, the novel methods and systems described herein may be embodied in a variety of other forms. Furthermore, various omissions, substitutions and changes in the form of the methods and systems described herein may be made without departing from the spirit of the inventions.

Overview

Data storage cells in solid-state memory, such as multi-level-per-cell (MLC) flash memory, may have distinct threshold voltage distribution ($V_t$) levels, corresponding to different memory states. For example, in an MLC implementation, different memory states in solid-state memory may correspond to a distribution of voltage levels ranging between reading voltage (VR) levels; when the charge of a memory cell falls within a particular range, one or more reads of the page may reveal the corresponding memory state of the cell. Programming or program verify voltages are used to program the memory cells. According to the programming charge level, memory cells store different binary data representing user data. For example, based on the charge level, each cell generally falls into one of the memory states, represented by associated data bits. Voltage distributions of different memory states of the memory cells can be separated, and reading voltage levels can advantageously be set to values in the margins between memory states.

Over time, and as a result of various physical conditions and wear from repeated program/erase (P/E) cycles, the margins between the various distribution levels may be reduced, so that voltage distributions overlap to some extent. Such reduction in read margin may be due to a number of factors, such as loss of charge due to flash cell oxide degradation, device usage which results in subjecting memory to P/E cycles, over-programming caused by erratic program steps, programming of adjacent erased cells due to heavy reads or writes in the locality of the cell (or write disturbs), and/or other factors, all of which may contribute to retention problems in a solid-state storage device.

Disclosed embodiments relate to an advanced programming or write precompensation method that extends the life of solid-state memory (e.g., NAND flash memory). As described above, memory such as NAND wears out due to repeated P/E cycles. In the case of NAND, the wear out mechanism is related to wear out or buildup of charge traps in the oxide of the NAND device. A program operation typically involves driving charges at high voltage through the NAND gate oxide in order to generate the NAND threshold voltage levels. In the early life of the NAND, the levels are well separated. Over time, the levels start to overlap, to a point where the channel cannot properly decode the data.

In some embodiments, program verify voltage levels are lowered as compared to default levels in the early life of the solid-state memory and a storage device effectively starts with overlapped levels that can produce a level of errors that is tolerable for the error detection and correction mechanism, such as Low Density Parity Code (LDPC). As the levels start to overlap more, the program verify voltage level is increased in one embodiment to reduce the overlap. In one embodiment, the overlap can be repeatedly reduced by this incremental verify voltage increase process until the default verify voltage is reached, at which point the solid-state memory is worn out as per operation under the default voltage. However, during the time while the programmed levels are overlapped, lower program verify voltages are applied which leads to less wear on the gate oxide in the memory. This results in less oxide damage and extends the life of the solid-state memory. Various embodiments disclosed here are applicable to both single-level cell (SLC) and multi-level cell (MLC) memory.

System Overview

FIG. 1 illustrates an example solid-state storage device 120 according to one embodiment of the invention. As is shown, the storage device 120 (e.g., solid state drive, etc.) includes a controller 130 and a non-volatile solid-state memory array 140, which comprises one or more blocks of storage, identified as Block "A" 142 through Block "N". Each block comprises a plurality of flash pages (F-pages). For example, Block A 142 of FIG. 1 includes a plurality of F-pages, identified as F-pages A (143), B, through N. In some embodiments, each "F-page" is a smallest grouping of memory cells in the non-volatile solid-state memory array 140 that can be programmed in a single operation or as a unit. Further, each F-page includes one or more error correcting code pages (E-pages). In the illustrated embodiment, each F-page includes four E-pages that are illustrated as four boxes, including E-page 144. Other embodiments may use F-pages or E-pages that are defined differently or each F-page may include greater or fewer than four E-pages.

The controller 130 can receive data and/or storage access commands from a storage interface module 112 (e.g., a device driver) in a host system 110. Storage access commands communicated by the storage interface 112 can include write and read commands issued by the host system 110. The commands can specify a logical block address in the storage device 120, and the controller 130 can execute the received commands in the non-volatile solid-state memory array 140. In a hybrid hard drive, data may be stored in magnetic media storage component (not shown in FIG. 1) in addition to the non-volatile solid-state memory array 140.

The storage device 120 can store data received from the host system 110 so that the storage device 120 can act as memory storage for the host system 110. To facilitate this function, the controller 130 can implement a logical interface. The logical interface can present to the host system 110 storage device memory as a set of logical addresses (e.g., contiguous address) where data can be stored. Internally, the controller 130 can map logical addresses to various physical memory addresses in the non-volatile solid-state memory array 140 and/or other memory module(s).

To implement error detection and correction, in one embodiment the controller 130 includes an error correction module 150. The error correction module 150 includes an encoder module 154 and a decoder module 156. In one embodiment, the encoder module 154 encodes data (e.g., host or user data) to be written to memory pages, such as E-pages, of the non-volatile solid-state memory array 140. The encoder module 154 may dynamically use different coding parameters to accommodate changing condition of the non-volatile solid-state memory array 140. Similarly, the decoder module 156 decodes data read from the memory pages and can similarly use different coding parameters.

In one embodiment, where the error detection and correction is based on LDPC, the coding parameters can include LDPC coding parameters, such as the column weight of a G (generator) or H (parity check) coding matrix, the row weight of a G or H coding matrix, a P matrix size (e.g., where the P matrix is a sub-matrix of a G or H coding matrix), and the like. Further, the encoder and decoder modules 154 and 156 can determine parity data for unpadded or padded user data, as well as decode user data having corresponding parity data and padding. In addition, the encoder and decoder modules 154 and 156 can adjust a code rate for coding data by adjusting the coding parameters. The controller 130 can further include internal memory (not shown), which may be of one or more suitable memory types. In some embodiments, the controller 130 is configured to perform the write precompensation functions as further described below.

Write Precompensation

Flash memory, such as multi-level cell (MLC) NAND flash memory, may store two or more bits of information per cell. For example, two-bit-per-cell memory cells can have 4 distinct programming voltage levels, and 3-bit-per-cell memory cells can have 8 distinct programming voltage levels, and so on. Therefore, individual memory cells can store different binary bits according to the amount of charge stored thereon. While certain embodiments disclosed herein are described in the context of MLCs, it should be understood that the concepts disclosed herein may be compatible with single level cell (SLC), three-level cell (TLC) technology (a type of MLC NAND), and/or other types of technology. Data is generally stored in MLC NAND flash memory in binary format.

Figure 2:
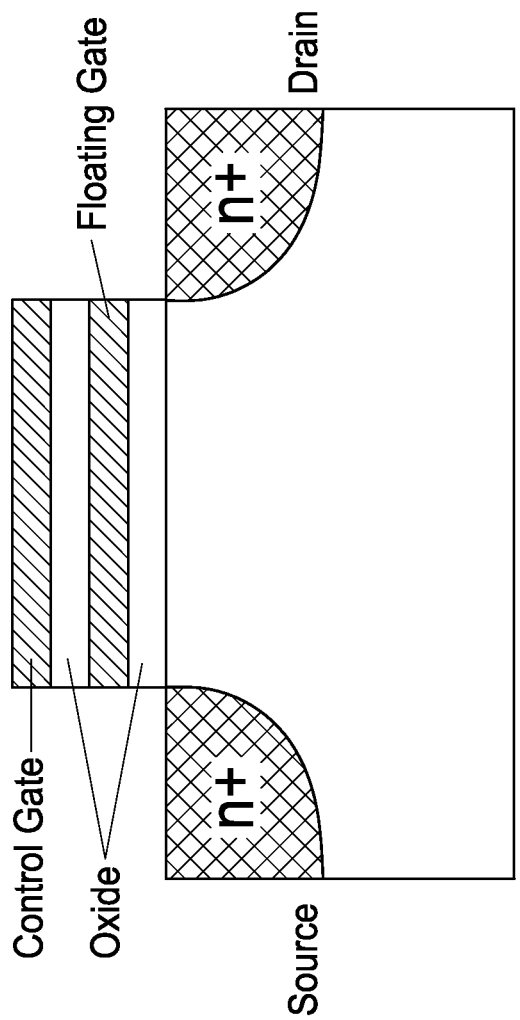
FIG. 2 illustrates an embodiment of a non-volatile solid-state memory cell.

FIG. 2 illustrates an embodiment of a non-volatile solid-state memory cell 200. The cell 200 can be part of an F-page of the non-volatile solid-state memory array 140, and store a single or multiple bits of information. As is illustrated, the cell 200 can comprise a transistor. In one embodiment, charge is stored in the floating gate by applying a large voltage across control gate and base of the transistor. Charge is trapped in the floating gate between the two oxide layers. In an embodiment when a single bit is stored in the cell 200, this allows the transistor to represent a binary "1", whereas a transistor without the trapped charge represents a binary "0". This can serve as a basic principle behind operation of flash memory. In an embodiment when a multiple bits, such as two bits, are stored in the cell 200, stored charge allows the transistor to represent binary states "00," "01," "10," and "11."

Figure 3:
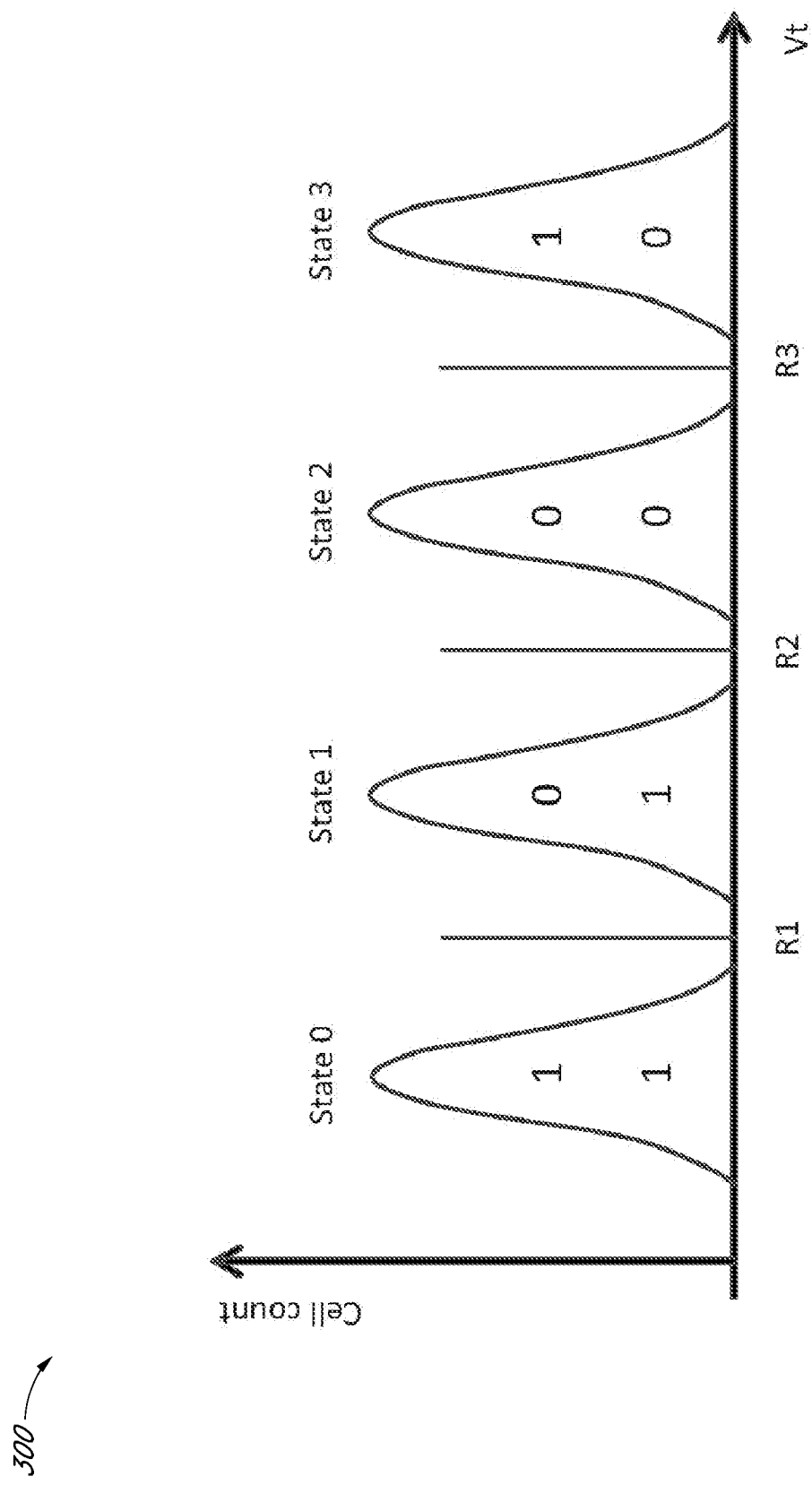
FIG. 3 is a graph illustrating a probability distribution of cells in a non-volatile solid-state memory array according to an embodiment.

FIG. 3 is a graph 300 illustrating a probability distribution of cells in a non-volatile solid-state memory array. In some embodiments, when new memory blocks are used in their early life, the voltage distributions are well separated as is illustrated on FIG. 3. The horizontal axis depicted in FIG. 3 represents cell threshold voltage level. The vertical axis represents the number of cells that have the corresponding threshold voltage values. Thus, the four distribution curves represent the number of cells, broken down by the four distributions, which have the corresponding threshold voltage values. As shown, the threshold voltage distribution of the memory cells may include a plurality of distinct levels, or states (e.g., States 0-3 in this example 2-bit-per cell MLC configuration, as shown). Reading reference values (i.e., voltage threshold levels R1-R3) may be placed between these levels, and can be used to determine the binary value stored in a memory cell.

While the graph 300 of FIG. 3 illustrates a distribution for 2-bit-per-cell flash memories, embodiments and features disclosed herein may be applicable to other types of coding schemes. With respect to the graph 300, the coding for States 0-3 (or E, A, B, and C respectively) can be, for example, '11,' '01,' '00,' and '10,' or any other coding. Each cell may generally fall into one of the illustrated states and correspondingly represents two bits. For one word line (WL), which can be connected to tens of thousands of cells in a memory array (e.g., NAND memory array), the lower digit of the cells may be referred to as the "lower page," and the upper digit may be referred to as the "upper page." For 3-bit-per-cell flash memories, there may also be intermediate digits, which may be referred to as "middle pages." Reading voltage levels and operations are dependent on the coding of these states. For example, for the coding as shown in FIG. 3 for the 2-bit-per-cell flash memories, one read at R2 may be required to read out the lower page, and two reads at both R1 and R3 may be needed to read out the upper page. As shown in the graph 300, these reading voltages may be selected between state distributions in the case where the distributions for different states are narrow so that there is no overlap between them.

Figure 4:
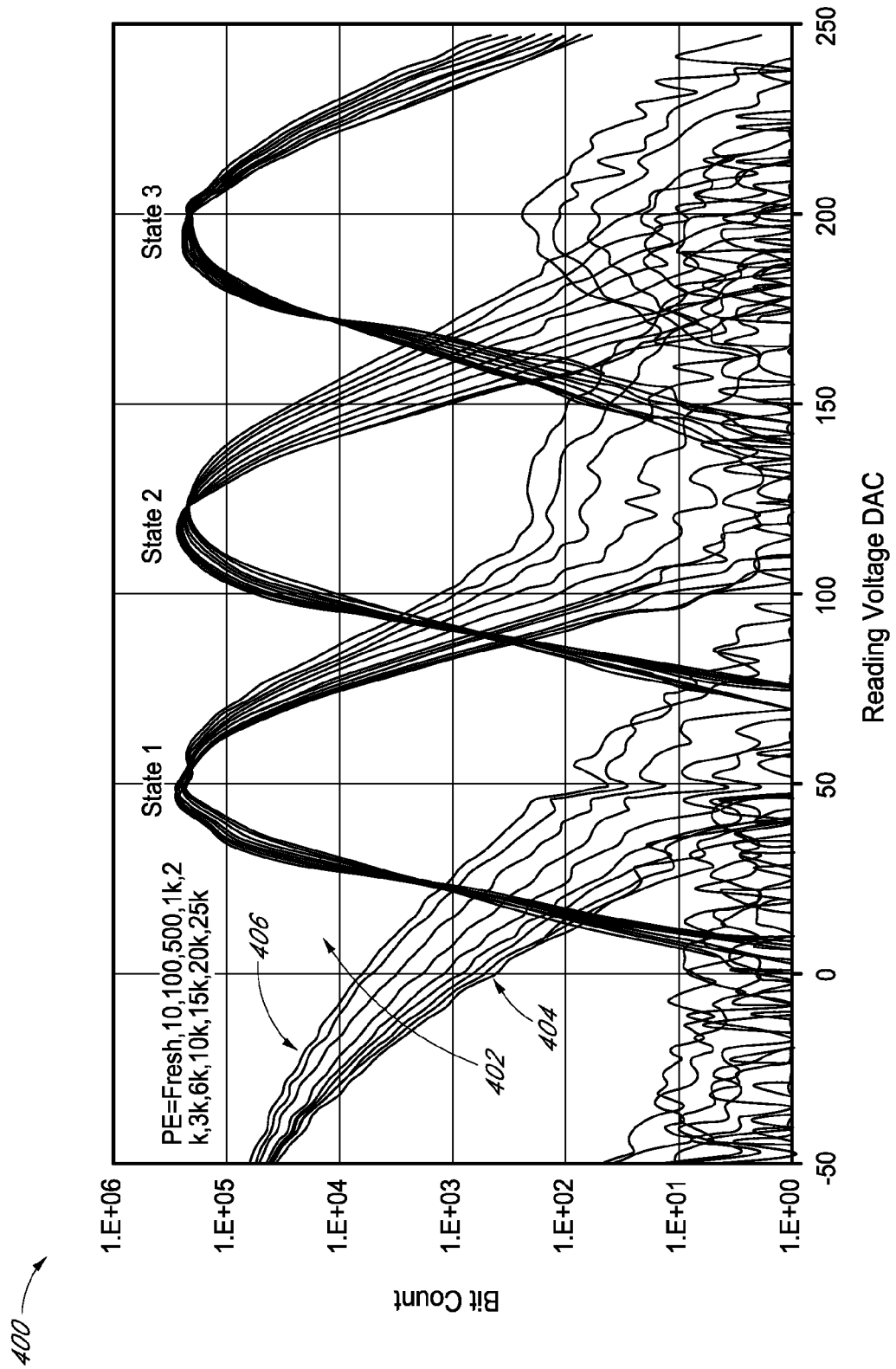
FIG. 4 is a graph illustrating shifts in probability distribution of cells in a non-volatile solid-state memory array according to an embodiment.

The gap between the levels (i.e., margin between programmed states), in which the reading voltage levels may advantageously be positioned in certain embodiments, can be referred to as a read margin. Over time, and as a result of various physical conditions and wear, for example from the memory being subjected to repeated P/E cycles, the read margins between the various distribution levels may be reduced, resulting in both data retention problems and high reading errors. This is shown in FIG. 4 which depicts a graph 400 illustrating shifts in probability distribution of cells in a non-volatile solid-state memory array. The horizontal axis depicted in FIG. 4 represents cell threshold voltage level (after being digitized by a digital-to-analog converter), and the vertical axis represents the number of cells that have the corresponding threshold voltage values. Various plots depicted in the graph 400 illustrate shifts due to the increase in the number of P/E cycles that memory is subjected to, such as 1 (or fresh memory), 10, 100, 500, 1,000, 2,000, 3,000, 6,000, 10,000, 15,000, 20,000, and 25,000. For example, the plot 404 illustrates the distribution of new (or fresh) memory that has been programmed for the first time. As another example, the plot labeled 406 illustrates the distribution of memory that has undergone 25,000 P/E cycles.

Over time, as memory wear builds up, the threshold voltage distributions become broader. In the graph 300 illustrated in FIG. 3, the voltage levels of the new (or lightly worn) memory blocks are well separated. This separation is also illustrated in FIG. 4 by plots of fresh (e.g., fresh memory that has not been programmed) or lightly worn memory, such as that illustrated by plot 404. At this point the residual or raw bit-error rate (RBER) is low, and few memory errors, such as reading errors, are experienced. However, as is illustrated by the arrow 402, the voltage distributions become wider as the P/E cycles count increases. For example, plot 406 is a voltage distribution of memory that has experienced a large number of P/E cycles (e.g., 25,000 P/E cycles). As the voltage distributions widen due to wear, the RBER and number or memory errors increase.

In some embodiments, in order to achieve a well-defined separation of voltage levels during beginning of life of the memory, high voltage levels (e.g., program verify voltage levels) are applied at programming. In some cases, high voltage levels are standard or default voltage levels that may be suggested by the memory manufacturer. Typically, such default voltage levels are used to program the memory cells.

Figure 5:
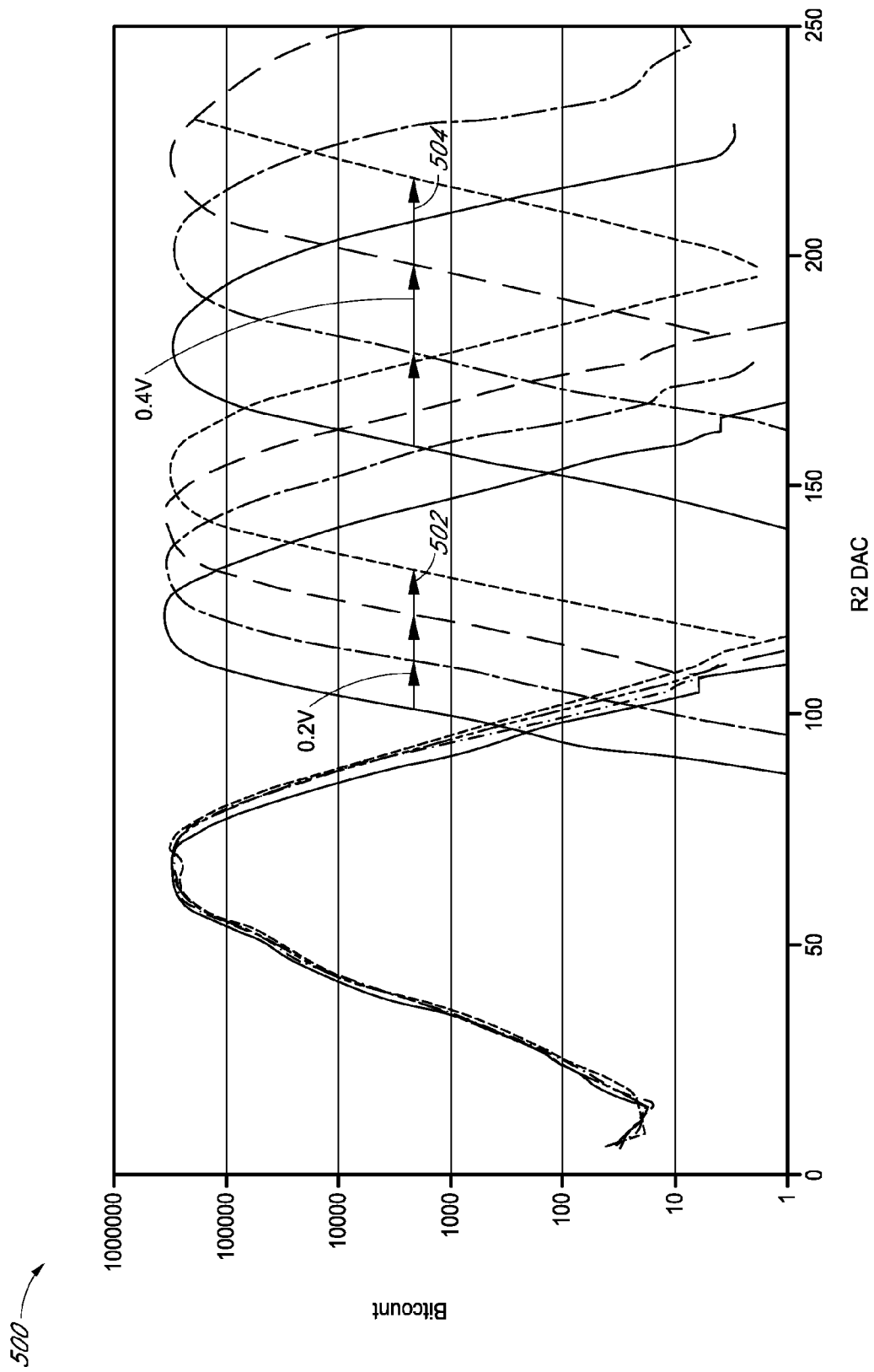
FIG. 5 is a graph illustrating initially setting and adjusting program verify voltage levels according to an embodiment.

FIG. 5 is a graph 500 illustrating initially setting and adjusting program verify voltage levels according to an embodiment. The horizontal axis depicted in FIG. 5 represents cell threshold voltage level, and the vertical axis represents the number of cells that have the corresponding voltage values. The voltage distributions depicted on the right side of the graph 500 can correspond to states 2 (or B) and 3 (or C). As is shown in FIG. 5, memory is initially and subsequently programmed such that the voltage distributions are less separated than those programmed at the default voltage values. This is evidenced by the overlap between the voltage distributions. For example, graph 500 illustrates that voltage distributions for the two states depicted on the right side of the graph (e.g., states 2 and 3) overlap when initial program verify voltage levels lower than default levels are used to program the memory at the beginning of life. For example, memory blocks and/or pages that have experienced less than about 100 P/E cycles may be at the beginning of life. This is in contrast with the well separated distributions depicted in graph 300 of FIG. 3. The initial program verify (or programming) voltage levels used to program unworn (or lightly worn) memory depicted in FIG. 5 are lower than those depicted in FIGS. 3 and 4. For example, the initial program verify voltage level for state 2 (or B) can be between 0.5-1 V lower than its default value, such as approximately 0.6 V lower, and the initial program verify voltage level for state 3 (or C) can be between 1-2 V lower than its default value, such as approximately 1.2 V lower. Setting the initial program verify voltages levels to lower levels can result in worse bit error rates (BER) or RBER in the early life of the memory but places less stress on the memory cells (e.g., the oxide of the transistors, such as that depicted in FIG. 2). As long as the errors experienced as a result of lowering the program verify voltage levels are below one or more error thresholds within the corrective power of the error detection and correction mechanism, using lower program verify voltage levels advantageously extends the life of the solid-state memory array 140.

Figure 7:
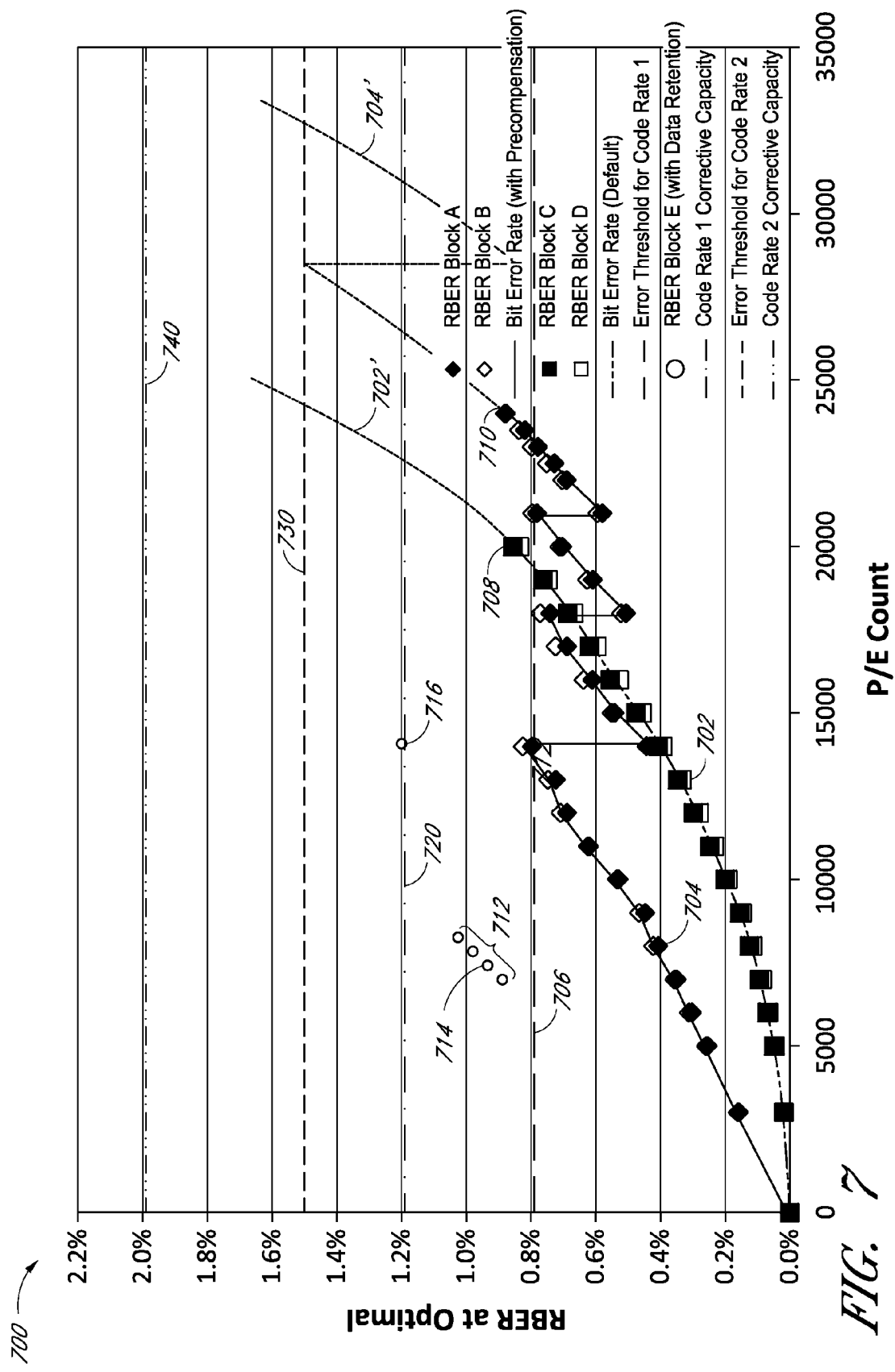
FIG. 7 is a graph illustrating memory errors versus program/erase (P/E) counts according to an embodiment.

As the memory repeatedly undergoes program and erase cycles, it degrades which results in a higher number of errors associated with reading data stored in the memory. In one embodiment, one or more error thresholds are selected to reflect or correspond to the corrective power of the error detection and correction mechanism. For example, an error threshold can be set or selected from the range between 0.1% and 5% RBER (or BER). For instance, 0.8% RBER error threshold is depicted in FIG. 7. In other embodiments, any suitable error level (or levels) can be used, such as less than 0.1%, greater than 5%, etc. For example, when LDPC is used the error level (or levels) can be selected from the range between 0.1% and 5%. Once the error threshold is reached, the program verify voltage levels are increased by the respective step sizes. As is illustrated in FIG. 5, state 2 (or B) program verify voltage level can be increased by a 0.2 V step size as is depicted by the arrow 502. State 3 (or C) program verify voltage level can be increased by 0.4 V step size as is depicted by the arrow 504. In one embodiment, program verify voltage levels for states 2 and 3 can be increased at the same time by the respective step sizes in order to decrease the overlap. Increasing the program verify voltage levels causes increase in the separation of the voltage distributions, which is turn can reduce the memory errors (as indicated by BER or RBER). Increasing program verify voltage levels can cause more stress on the memory cells (e.g., the oxide of the transistors, such as that depicted in FIG. 2). Although 0.2 V and 0.4 V step sizes are depicted in the embodiment illustrated in FIG. 5, in other embodiments any suitable voltage step sizes can be used, such as voltages selected from the range between 0.1 V or less and 1.6 V or more. In some embodiments, the step sizes corresponding to different states can be the same.

In one embodiment, the process of adjusting or shifting program verify voltages levels outlined above is repeated until the default voltage levels are reached. At that point, the default voltage is used going forward without shifting. In various embodiments, the threshold error level (or levels) that triggers program verify voltage levels increases can vary depending on a number of factors, such as the capability of error detection and correction, performance of the overall system, etc. In one embodiment, the threshold error level can be set to correspond to the absolute or maximum corrective power of capability of the error detection and correction mechanism, or at a certain offset from or percentage of the maximum corrective capability. In addition, the size of the step can also vary depending on the embodiments. In some embodiments, program verify voltage level can be increased beyond the default voltage level. Although graph 500 illustrates treatment of two voltage distributions depicted on the right side of the graph, which can correspond to states 2 (or B) and 3 (or C), other memory states, such as states 0 (or E) and 1 (or A), can be treated similarly. In some embodiments, the illustrated approaches can be applied to SLC memory or MLC memory that stores more than two bits.

Figure 6:
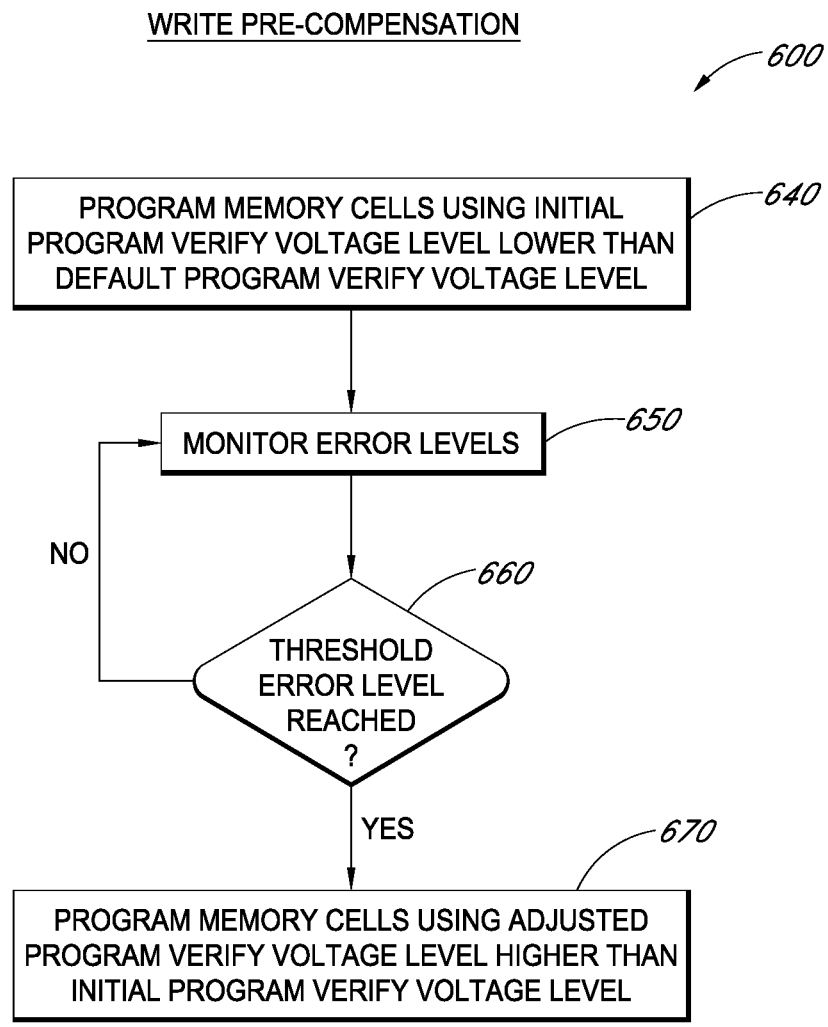
FIG. 6 is a flowchart of a process of performing write precompensation according to an embodiment.

FIG. 6 is a flowchart of a process 600 of performing write precompensation according to an embodiment. The process 600 can be performed by the controller 130 and/or the error correction module 150. The process 600 starts in block 640 where it programs memory pages (and cells) of the non-volatile solid-state memory array 140 using an initial program verify voltage level (or levels) that is lower than the default program verify voltage level (or levels). In block 650, the process 600 monitors the error levels of the memory cells. For example, the BER or RBER can be monitored by the error correction module 150. If the process 600 determines in block 660 that the error levels are below an error threshold level (or levels), the process continues to program the memory cells using the initial program verify voltage level (or levels) and monitor the error levels. In one embodiment, the process 600 determines in block 660 whether the error levels are within a tolerance range of the error detection and correction mechanism. If the process 600 determines in block 660 that the error levels have reached (or exceed) the error threshold level (or levels), the process transitions to block 670 where it adjusts the program verify voltage level (or levels) by a respective step size (or sizes). The adjusted program verify voltage level (or levels) is higher than the initial program verify voltage level (or levels).

FIG. 7 is a graph 700 illustrating memory errors versus program/erase (P/E) counts according to an embodiment. The horizontal axis depicted in FIG. 7 represents P/E counts, and the vertical axis represents RBER. Curve 704 illustrates the RBER vs. P/E count of the memory operating under an embodiment of the write precomensation mechanism, while curve 702 illustrates the RBER vs. P/E count of the memory operating without write precompensation. In one embodiment, curve 702 is generated by plotting RBER vs. P/E counts for memory Blocks C and D and fitting a function. For example, a regression can be performed. In one embodiment, curve 704 is generated by plotting RBER vs. P/E counts for memory Blocks A and B and fitting a function. Line 706 illustrates an error threshold (or target RBER) for performing program verify voltage level adjustment, which corresponds to approximately 0.8% RBER.

The error threshold(s) at which the program verify voltage adjustments are made can correspond to a predetermined value(s), or different value(s) corresponding to different adjustment(s). In one embodiment, multiple levels of absolute or maximum corrective capacity of the error detection and correction mechanism can be used due to different code rates used by the corresponding error detection and correction mechanism (e.g., LDPC). In one embodiment, the lower the code rate (e.g., more bytes are used for error detection and correction), the higher the corrective capacity. In one embodiment, the error threshold depicted by line 706 (e.g., approximately 0.8% RBER) can correspond to the error threshold for the first code rate (or code rate 1), and the error threshold depicted by line 730 (e.g., approximately 1.5% RBER) can correspond to the error threshold for the second code rate (or code rate 2). The first code rate has an absolute or maximum corrective capacity depicted by line 720 (e.g., approximately 1.2% RBER), and the second code rate has a higher absolute or maximum corrective capacity as depicted by line 740 (e.g., approximately 2.0% RBER). In some embodiments, more than two different code rates are used. In some embodiments, various different error detection and correction mechanisms can be used. For example, one mechanism may be based on LDPC and another mechanism may be based on a different ECC scheme.

In one embodiment, the error levels experienced by memory after wear exceed the error threshold (which may correspond to maximum correction capability of the error detection and correction mechanism) as illustrated by point 708 for operation without write precompensation and 710 for operation with write precompensation. In the illustrated embodiment, curve 704 exceeds the error threshold at approximately 23,000 P/E counts, which is approximately 18% more than the point at which curve 702 exceeds the error threshold (at approximately 19,500 P/E counts). Using write precompensation results in additional life of the memory of approximately 18%. This additional life is at least in part due to reduced stress on the transistor oxide as a result of reduced or lowered program verify voltage levels. Although approximately 18% extension of memory life is illustrated in FIG. 7, in other embodiments greater or smaller gains are achieved.

FIG. 7 illustrates that utilizing write precompensation (curve 704) causes greater RBER (or number of errors) than not utilizing write precompensation (curve 702) at or near beginning of life. This increase in the error levels due to using lower program verify voltage levels is within the corrective capacity of the error detection and correction mechanism, such as LDPC. Curve 704 reaches the error threshold (which can be a signifier of the "end of life" of the memory) after a greater number of P/E cycles (or operational life) than curve 702. This results in gains of additional life of the memory. Projected RBER without using write precompensation (curve 702') and projected RBER with using write precompensation (curve 704') also illustrate that using write precompensation provides additional life of the memory as curve 704' exceeds the maximum corrective capacity of the first code rate (line 720) after a greater number of P/E cycles than curve 702'.

In one embodiment, curves 702 and 704 correspond to memory operations which do not take into account data retention issues. It is illustrative to depict RBER vs. P/E counts for memory subjected to data retention. For example, data retention can be stimulated by subjecting the memory to higher temperatures (e.g., baking the memory). For instance, memory can be baked to stimulate storing data for three months at 40° C. Points 712 and 716 illustrate RBER vs. P/E counts for memory (e.g., Block E) in which data retention is taken into account. As is illustrated, the error levels are higher for same P/E counts as those depicted in curves 702 and 704. For example, point 714 depicts approximately 0.5% greater RBER than the point of curve 704 which corresponds to the same P/E count. As is illustrated by point 716, the error level of memory in which data retention is taken into account reaches the absolute corrective capacity depicted by line 720 (e.g., approximately 1.2%). The P/E count at which this occurs can be an indicator for performing program verify voltage adjustment for memory in which data retention is not taken into account. As is illustrated by the RBER drop in curve 704, program verify voltage adjustment (increase) is performed at the P/E count corresponding to point 716. The RBER of curve 704 for the point at the P/E count of point 716 can be used as the error threshold 706.

In one embodiment, when multiple levels of maximum corrective capacity of the error detection and correction mechanism are used by the error detection and correction mechanism, the second code rate has higher corrective capacity than the first code rate. As is illustrated in FIG. 7, line 740 which corresponds to the maximum corrective capacity of the second code rate (e.g., approximately 2.0% RBER) is higher than line 720 which corresponds to the maximum corrective capacity of the first code rate (e.g., approximately 1.2% RBER). When all program verify voltage adjustments corresponding to write precompensation at the first code rate have been performed, the code rate can be switched (e.g., lowered) to the second code rate. This increases the corrective capacity. In one embodiment, when the projected RBER with using write precomensation (curve 704') exceeds the maximum corrective capacity of the first coder rate (line 720), the error detection and correction mechanism can lower the code rate to the second code rate, which has a higher maximum corrective capacity (line 740). At that time, the error threshold can be set higher to the error threshold of the second code rate (line 730), and write precompensation can be executed at the second code rate. Life of the memory can thus be extended.

Other Variations

Those skilled in the art will appreciate that in some embodiments, other approaches and methods can be used. For example, although the example embodiments are described in the context of an LDPC encoder and decoder, the embodiments are applicable to iterative decoders other than LDPC decoders such as soft decision decoding of Reed-Solomon codes, polar decoders, turbo codes, etc. As another example, voltage levels associated with programming other than program verify voltage levels can be lowered and adjusted instead of or in addition to program verify voltage levels. For instance, programming voltage levels can be lowered initially and adjusted over lifetime of the memory. As yet another example, the non-volatile solid-state memory array can be implemented using NAND flash memory devices. Other types of solid-state memory devices can alternatively be used, such as array of flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistance RAM (RRAM), NOR memory, EEPROM, Ferroelectric Memory (FeRAM), Magnetoresistive RAM (MRAM), other discrete NVM (non-volatile solid-state memory) chips, or any combination thereof. In one embodiment, the non-volatile solid-state memory array preferably includes multi-level cell (MLC) devices having multi-level cells capable of storing more than a single bit of information, although single-level cell (SLC) memory devices or a combination of SLC and MLC devices may be used. In one embodiment, the storage device 120 can include other memory modules, such as one or more magnetic memory modules. Other forms of storage (e.g., battery backed-up volatile DRAM or SRAM devices, magnetic disk drives, etc.) may additionally or alternatively be used. The actual steps taken in the disclosed processes, such as shown in FIG. 6, may differ from those shown in the figures. Depending on the embodiment, certain of the steps described above may be removed, others may be added.

While certain embodiments of the inventions have been described, these embodiments have been presented by way of example only, and are not intended to limit the scope of the inventions. Indeed, the novel methods and systems described herein may be embodied in a variety of other forms. Furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions. For example, the various components described may be implemented as software and/ or firmware on a processor, ASIC/FPGA, or dedicated hardware. For example, those skilled in the art will appreciate that in some embodiments, the actual steps taken in the processes of some embodiments may differ from those shown in the figures. Depending on the embodiment, certain of the steps described in the example above may be removed, others may be added, and the sequence of steps may be altered and/or performed in parallel. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure.

What is claimed is:

1. A data storage device comprising:
a non-volatile solid-state memory array comprising a plurality of pages; and
a controller, comprising:
an error correction module configured to use a plurality of code rates corresponding to levels of corrective capability for data from the plurality of pages, the controller configured to:
program at least some cells of the plurality of pages at a first initial program verify voltage level associated with a first programming state, the first initial program verify voltage level being lower than a first default program verify voltage level associated with the first programming state;
monitor error levels associated with reading data from the plurality of pages to determine when a threshold error level of a plurality of threshold error levels has been reached, the threshold error levels corresponding to the plurality of code rates; and
when the threshold error level is determined to have been reached, program at least some cells of the plurality of pages at a first adjusted program verify voltage level associated with the first programming state, the first adjusted program verify voltage level being higher than the first initial program verify voltage level.

2. The data storage device of claim 1, wherein programming at least some cells at first initial program verify voltage level produces data error characteristics within a tolerance range of the error correction module.

3. The data storage device of claim 2, wherein the error correction module comprises an LDPC encoder module and an LDPC decoder module.

4. The data storage device of claim 1, wherein the first adjusted program verify voltage level is approximately 0.2 V higher than the first initial program verify voltage level.

5. The data storage device of claim 1, wherein the first adjusted program verify voltage level is lower than the first default program verify voltage level.

6. The data storage device of claim 1, wherein the controller is further configured to:
program at least some cells of the plurality of pages at a second initial program verify voltage level associated with a second programming state, the second initial program verify voltage level being lower than a second default program verify voltage level associated with the second programming state; and
when the threshold error level is determined to have been reached, program at least some cells of the plurality of pages at a second adjusted program verify voltage level associated with the second programming state, the second adjusted program verify voltage level being higher than the second initial program verify voltage level.

7. The data storage device of claim 6, wherein the second adjusted program verify voltage level is approximately 0.4 V higher than the second initial program verify voltage level.

8. The data storage device of claim 1, wherein a voltage state distribution of the plurality of pages comprises overlapping states when the pages are programmed using the first initial program verify voltage level and the pages have experienced less than about 100 program/erase cycles.

9. The data storage device of claim 1, wherein the controller is further configured to:
when the threshold error level has been reached subsequently to the controller programming at least some cells at the first adjusted program verify voltage level, program at least some cells at a next adjusted program verify voltage level associated with the first programming state, the next adjusted program verify voltage level being higher than the first adjusted program verify voltage level.

10. The data storage device of claim 9, wherein the next adjusted program verify voltage level is lower than the first default program verify voltage level.

11. In a data storage device comprising a non-volatile solid-state memory array and a controller, a method of programming memory cells, the method comprising:
programming at least some cells of a plurality of pages of a non-volatile memory array at a first initial program verify voltage level associated with a first programming state, the first initial program verify voltage level being lower than a first default program verify voltage level associated with the first programming state;
using a plurality of code rates corresponding to levels of corrective capability for data from the plurality of pages;
monitoring error levels associated with reading data from the plurality of pages to determine when a threshold error level of a plurality of threshold error levels has been reached, the threshold error levels corresponding to the plurality of code rates; and
when the threshold error level is determined to have been reached, programming at least some cells of the plurality of pages at a first adjusted program verify voltage level associated with the first programming state, the first adjusted program verify voltage level being higher than the first initial program verify voltage level,
wherein the method is performed by the controller.

12. The method of claim 11, wherein the first adjusted program verify voltage level is approximately 0.2 V higher than the first initial program verify voltage level.

13. The method of claim 11, wherein the first adjusted program verify voltage level is lower than the first default program verify voltage level.

14. The method of claim 11, further comprising:
programming at least some cells of the plurality of pages at a second initial program verify voltage level associated with a second programming state, the second initial program verify voltage level being lower than a second default program verify voltage level associated with the second programming state; and
when the threshold error level is determined to have been reached, programming at least some cells of the plurality of pages at a second adjusted program verify voltage level associated with the second programming state, the second adjusted program verify voltage level being higher than the second initial program verify voltage level.

15. The method of claim 14, wherein the second adjusted program verify voltage level is approximately 0.4 V higher than the second initial program verify voltage level.

16. The method of claim 11, wherein a voltage state distribution of the plurality of pages comprises overlapping states when the pages are programmed using the first initial program verify voltage level and the pages have experienced less than about 100 program/erase cycles.

17. The method of claim 11, further comprising:
when the threshold error level has been reached subsequently to programming at least some cells at the first adjusted program verify voltage level, programming at least some cells of the plurality of pages at a next adjusted program verify voltage level associated with the first programming state, the next adjusted program verify voltage level being higher than the first adjusted program verify voltage level.

18. The method of claim 17, wherein the next adjusted program verify voltage level is lower than the first default program verify voltage level.

19. The method of claim 11, further comprising encoding data using an LDPC encoder and writing the data to the plurality of pages.

20. The data storage device of claim 1, wherein the error levels represent raw bit-error-rates (RBERs) or BERs and wherein the threshold error level represents a threshold RBER or BER level.

21. The data storage device of claim 20, wherein the threshold RBER or BER level is in the range from 0.1% to 5% RBER or BER.

22. The data storage device of claim 1, wherein the controller is further configured to repeat programming the at least some cells of the plurality of pages until the first adjusted program verify voltage level reaches the first default program verify voltage level.

23. The data storage device of claim 1, wherein the threshold error level is based at least in part on the code rate used for the cells of the plurality of pages programmed at the first initial program verify voltage level.

24. The data storage device of claim 1, wherein the controller is further configured to program the at least some cells of the plurality of pages at the first adjusted program verify voltage level immediately after the determination that the threshold error level has been reached.

25. The data storage device of claim 1, wherein the controller is further configured to program the at least some cells of the plurality of pages at the first adjusted program verify voltage level solely based on the determination that the threshold error level has been reached.

* * * * *